(12) United States Patent
Jean-Mistral et al.

(10) Patent No.: US 7,969,070 B2
(45) Date of Patent: Jun. 28, 2011

(54) ELECTROACTIVE POLYMER TRANSDUCER

(75) Inventors: Claire Jean-Mistral, Grenoble (FR); Jean-Jacques Chaillout, Saint Etienne de Crossey (FR); Ghislain Despesse, Saint Egreve (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/566,783

(22) Filed: Sep. 25, 2009

(65) Prior Publication Data

US 2010/0079037 A1 Apr. 1, 2010

(30) Foreign Application Priority Data

Sep. 26, 2008 (FR) .................................... 08 56489

(51) Int. Cl.
*H01L 41/113* (2006.01)
*H01L 41/18* (2006.01)
(52) U.S. Cl. ...................... 310/339; 310/324; 310/800
(58) Field of Classification Search .................. 310/324, 310/328, 339, 800
See application file for complete search history.

(56) References Cited

U.S. PATENT DOCUMENTS

| | | | | | |
|---|---|---|---|---|---|
| 3,816,774 | A | * | 6/1974 | Ohnuki et al. | 310/332 |
| 4,056,742 | A | * | 11/1977 | Tibbetts | 310/357 |
| 5,515,341 | A | * | 5/1996 | Toda et al. | 367/140 |
| 6,411,013 | B1 | * | 6/2002 | Horning | 310/330 |
| 7,034,432 | B1 | | 4/2006 | Pelrine et al. | |
| 7,436,099 | B2 | * | 10/2008 | Pei et al. | 310/311 |
| 2001/0035723 | A1 | * | 11/2001 | Pelrine et al. | 318/116 |
| 2007/0200466 | A1 | * | 8/2007 | Heim | 310/800 |
| 2009/0236939 | A1 | * | 9/2009 | Heim | 310/324 |

FOREIGN PATENT DOCUMENTS

| | | |
|---|---|---|
| WO | 01/86695 A | 11/2001 |
| WO | 02/37660 A | 5/2002 |
| WO | 03/028122 A | 4/2003 |

OTHER PUBLICATIONS

"Search Report" issued by the French Patent Office on Jan. 8, 2009 in French Application 08/56489.

"Recent Developments in Electro-Active Polymera", Brook, J.G., Plastics and Rubber Processing and Applications, Applied Science Publishers, London, G.B., vol. 8, No. 4, Jan. 1, 1987, XP009052870.

* cited by examiner

*Primary Examiner* — Thomas M Dougherty
(74) *Attorney, Agent, or Firm* — Vedder Price PC

(57) ABSTRACT

An electroactive polymer transducer comprising a membrane formed of an approximately rectangular electroactive polymer portion surrounded by two electrodes, at least two points of the membrane being connected to rigid supports, and comprising at least one deformable element for limiting the deformations that the membrane may undergo, the limiting element having a meandering form and being connected to the membrane in several approximately distributed points.

15 Claims, 4 Drawing Sheets

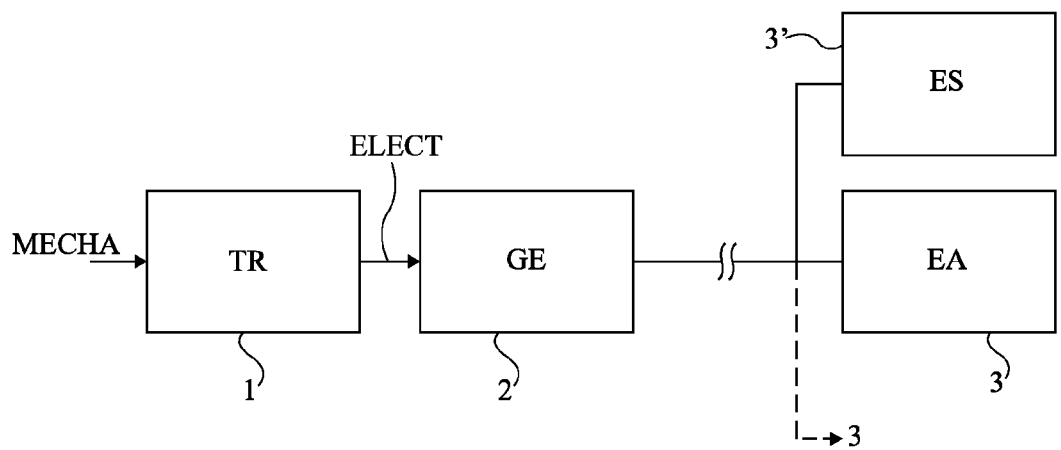
Fig 1
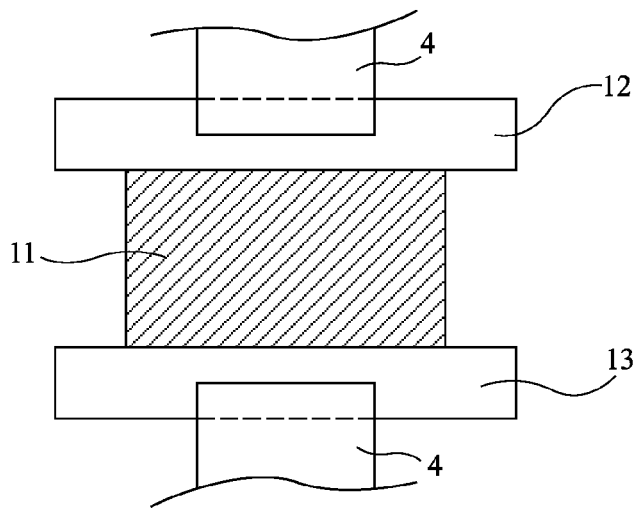
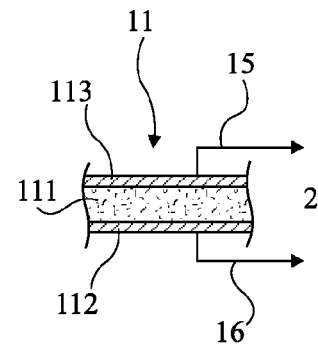
Fig 2A            Fig 2B
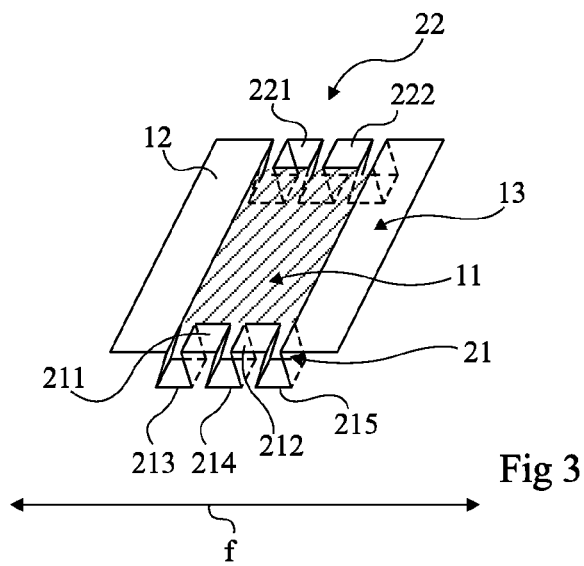
Fig 3

ELECTROACTIVE POLYMER TRANSDUCER

FIELD OF THE INVENTION

The present invention generally relates to systems for transforming a mechanical deformation into electric power and vice versa by using electroactive polymers. The present invention more specifically relates to the forming of a flexible dielectric polymer-based transducer capable of transforming a mechanical elongation that it undergoes into electric power.

DISCUSSION OF PRIOR ART

Deformable flexible structures capable of transforming a mechanical deformation applied thereto into electric power and vice versa use electroactive polymers, and more specifically dielectric polymers. Typically, a polymer film forms the dielectric of a variable capacitive element and is sandwiched between two flexible electrodes. The assembly forms an electroactive structure having its deformations (stretching/retraction) causing a surface and thickness modification which generates a variation of the capacitance of the element formed. The motion of the object or of the objects to which the structure is attached enables it to take two states (a stretched state and a retracted state). This variation translates as two different values of the structure capacitance. The application of a given bias voltage when the structure thickness is contracted causes, as its thickness is stretched, a decrease of the charges in the dielectric under the effect of the capacitance decrease ($Q=CV$). Charges are transferred from the structure to a storage unit. The resulting power can be recovered by an appropriate system. Different cycles may be envisaged, the best known being the cycles at constant electric field, at constant charge, or at constant voltage. The electric charge and discharge cycles are synchronized, by an adapted electric management circuit, on these two membrane deformation states enabling to recover power (electrostatic recovery).

Such structures can be used to convert a deformation of an object under the effect of external stress (for example, a textile, a wire netting, a fishnet, the strings of a tennis racket, the sail of a ship, etc.) or to convert the mechanical power at the level of a connection between two rigid elements in motion with respect to each other (for example, expansion joints, dampers, hinges, etc.) into electric power.

Such structures may also be used to detect local deformations in a sensor function.

For a proper operation, the electroactive membrane is generally attached at least at two points to the system causing the deformation.

Various solutions are described, for example, in US patents U.S. Pat. Nos. 6,768,246 and 7,034,432.

A difficulty lies in the limitation of the mechanical stress that can be applied to the structure. Indeed, too much stress may break the electroactive membrane.

Another difficulty is to make the deformation in the active area as uniform as possible to homogenize the wearing of the structure and to optimize the power recovery for a given bulk.

Electroactive polymers, and more specifically dielectric polymers, are widely used in actuator mode as artificial muscles. A voltage is applied to the structure, which deforms to a state of equilibrium between the mechanical and electric forces developed within said structure. It may also be useful to limit the deformations undergone by the polymer to avoid a mechanical breakage of the membrane or to make the deformations uniform to obtain a motion which is more regular (for example, more fluid). Conventionally, the electric voltage applied to the polymer is decreased to decrease its mechanical stretching.

SUMMARY

The present invention aims at overcoming all or part of the disadvantages of flexible electroactive, and more specifically dielectric polymer-based structures.

The present invention more specifically aims at uniformizing the deformations undergone by the active portion of the structure (electroactive polymer and electrodes).

Another embodiment of the present invention aims at optimizing the power recovery in the structure.

To achieve all or part of these objects as well as others, the present invention provides an electroactive polymer transducer comprising a membrane formed of an approximately rectangular electroactive polymer portion between two electrodes, at least two points of the membrane being connected to rigid supports, the transducer comprising at least one deformable element for limiting the deformations that the membrane is likely to undergo and the limiting element having a meandering form and being connected to the membrane at several approximately distributed points.

According to an embodiment of the transducer, the electrodes sandwich the membrane.

According to an embodiment of the transducer, the electrodes are on a same side of the membrane.

According to an embodiment of the transducer, the limiting element undergoes deformations non coplanar to the deformations of the membrane.

According to an embodiment of the transducer, two supports are in the plane of the membrane and are approximately perpendicular to the limiting element.

According to an embodiment of the transducer, the membrane is surrounded by a non-active area.

According to an embodiment of the transducer, said area is not deformable in the deformation direction of the membrane.

According to an embodiment of the transducer, several parallel limiting elements are provided.

According to an embodiment of the transducer, the meanders formed by the limiting elements are in planes perpendicular to the plane of the membrane.

According to an embodiment of the transducer, the limiting elements and the supports are one and the same part forming a frame around the membrane.

According to an embodiment of the transducer, several membranes are superposed and share same supports and limiting elements.

According to an embodiment of the transducer, the elongation of the meandering form is limited by stop elements.

The present invention also provides a method for recovering power from a mechanical stretching, comprising at least one transducer and one electronic circuit for managing the charge and the discharge of the transducer.

The present invention also provides an actuator system comprising an electronic circuit for generating an electric field and at least one transducer such as described hereabove.

The foregoing objects, features, and advantages, as well as others, will be discussed in detail in the following non-limiting description of specific embodiments in relation with the appended drawings.

BRIEF DESCRIPTION OF THE DRAWINGS

FIG. 1 is a simplified block diagram of an embodiment of a power recovery system of the type to which the present invention applies;

FIG. 2A is a top view of a usual flexible structure;

FIG. 2B is a partial view of an electroactive membrane;

FIG. 3 is a simplified perspective view of an embodiment of an electroactive polymer structure;

The same elements have been designated with the same reference numerals in the different drawings.

DETAILED DESCRIPTION

Figure 4A:
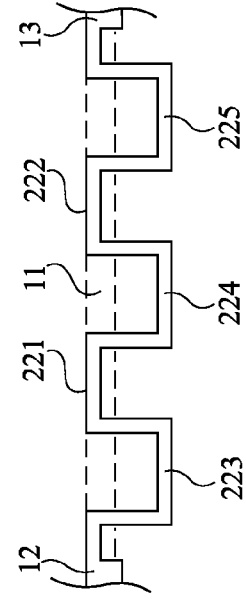
FIGS. 4A and 4B are cross-section views of the structure of FIG. 3, respectively in retracted and stretched position.

For clarity, only those elements which are useful to the understanding of the present invention have been shown and will be described. In particular, the obtaining of electroactive polymer membranes and of the power collection electrodes has not been detailed, the present invention being compatible with usual structures. Further, the destination of the power recovered by the described structures has not been detailed either, the present invention being here again compatible with usual applications.

FIG. 1 is a functional block diagram illustrating an embodiment of a power recovery system.

An electroactive polymer structure 1 (TR) may be submitted to mechanical stress MECHA which is converted into electric power ELECT. The obtained electric power ELECT is shaped by an electric management circuit (block 2, GE) and is used by one or several electric applications 3 (EA) or is stored within a storage element 3' (ES) of cell, battery or capacitor type. For a structure operating in actuator mode, the application of an electric field generates a deformation of the structure.

FIGS. 2A and 2B respectively are a top view and a partial cross-section view of a usual electroactive polymer structure. A membrane 11, formed of an electroactive polymer 111 (FIG. 2B) surrounded by two electrodes 112 and 113 intended to be connected to an electric conversion circuit (2, FIG. 1) is maintained at two ends by rigid supports 12 and 13. The supports are called rigid because they must keep the polymer approximately planar, especially if it is pre-stressed. The Young's modulus of the supports is generally 1,000 times greater than that of the polymer. Supports 12 and 13 are, in the example of FIG. 2, attached to elements 4 connected to the object providing the mechanical stress to enhance a main load. However, a connection part (not shown) may be interposed between supports 12 and 13 and connection element 4 to give the structure more degrees of liberty.

Membrane 11 may be attached to its support by any adapted means, for example, it may be glued by its ends to the supports, snapped between the supports and a spacer, etc.

Electrodes 111 and 112 are, for example, conductive carbon or silver grease layers to which are connected wires or conductive tracks 15 and 16, or any other means, appropriate for the object, of conduction towards control electronics 2.

Membrane 11 follows motions of the object to which it is attached essentially by undergoing tensile-compressive stress authorized by the connections between the recovery structure and the moving or deforming objects. There generally is a privileged deformation direction for useful stress. Due to its flexibility and to the connections arranged between the structure and the object, compound stress or even torsion is authorized, but not dominant.

In an alternative embodiment, the membrane is approximately in the same plane as both electrodes instead of forming a stack with the electrodes. For example, the electrodes are parallel with each other and in a same plane at either ends of a square membrane, which is free of electrodes in its central area. The electrodes can then contact the same face or opposite faces of the membrane.

FIG. 3 is a simplified perspective view of an embodiment of an electroactive polymer structure.

As compared with the structure of FIGS. 2A and 2B, the two rigid supports 12 and 13 are connected to each other by elements 21 and 22 for limiting the stretching capable of being applied to active membrane 11. Supports 12 and 13 and limiters 21 and 22 may form one and the same part or several attached parts so that the structure is as coplanar as possible and has the anticipated mechanical properties. Limiters 21 and 22 are preferably positioned in the third dimension with respect to the structure plane. In this example, they are arranged laterally with respect to membrane 11 and have meanders in planes perpendicular to the plane of membrane 11. The meandering shapes are here formed of rectilinear sections but may have any other shape (for example, sinusoidal, triangular, etc.). Membrane 11 is attached to portions or points of the meanders which are present in its plane. Preferably, the distribution of the connection points (by gluing, snapping, etc.) is even along the length of the limiters.

In FIG. 3, supports 12 and 13, membrane 11 and upper sections 211, 212, 221, and 222 of limiters 21 and 22 are approximately coplanar.

The width and the nature of limiters 21 and 22 in the membrane plane depend on the material forming said limiters and on the desired mechanical strength.

Figure 4B:
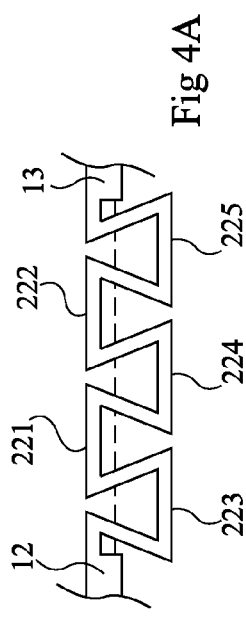

FIGS. 4A and 4B are simplified cross-section views of the structure of FIG. 3, respectively in contracted position and in stretched position. The limiters pass from an idle position (FIG. 4A) to a stretched position (FIG. 4B). These limiters are deformable and have a meandering shape.

Figure 4C:
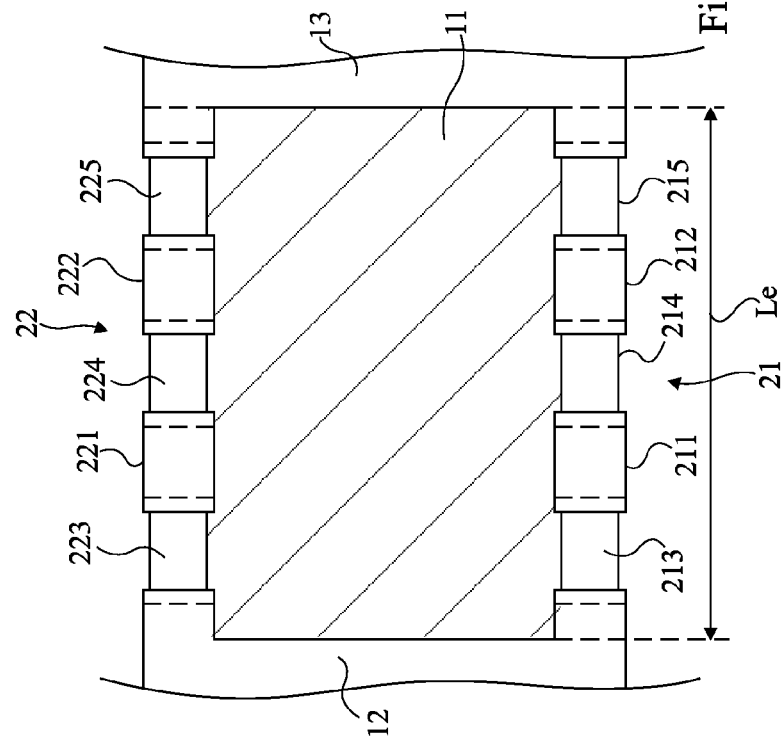
FIGS. 4C and 4D are top views respectively corresponding to FIGS. 4A and 4B.
Figure 4D:
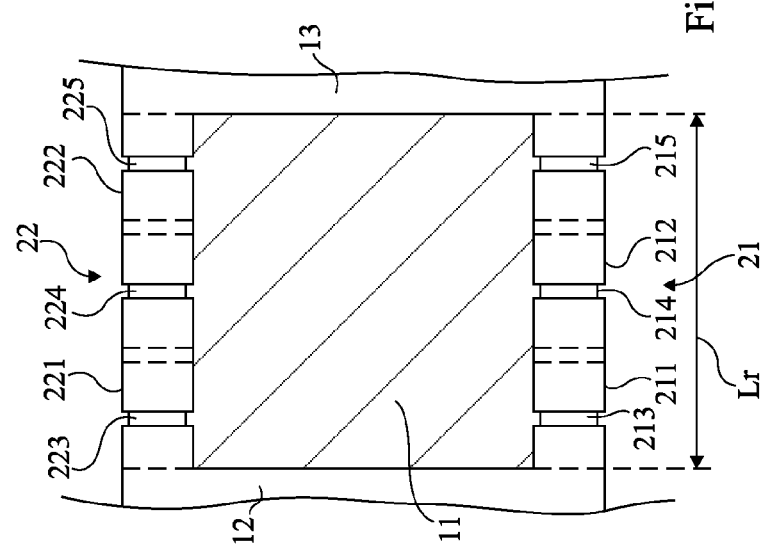

FIGS. 4C and 4D are corresponding top views.

In compressed position (FIGS. 4A and 4C), the meanders of limiters 21 and 22 follow, in cross-section, approximately triangular patterns and the sections parallel to the plane of membrane 11 (upper sections 211, 212, 221, 222 and lower sections 213, 214, 215, 223, 224, 225) are brought closer to one another in their respective planes.

Under the effect of a tension on support elements 12 and 13 in the direction indicated by arrow f (FIG. 3), the structure is stretched in this direction. Limiting elements 21 and 22 deform (from the shape illustrated in FIG. 4A to that illustrated in FIG. 4B), to reach a preset limiting shape. Once this geometric shape has been reached, limiters 21 and 22 no longer deform and keep this geometric shape as long as the tensile effect is present. They thus limit the possible stretching of the membrane and minimize risks of mechanical breakage. Further, limiting elements 21 and 22 add rigidity against parasitic stress (torsion) capable of being applied to the structure and thus favor the deformation of the structure in its main direction(s).

In stretched position (FIGS. 4B and 4D), the meanders for example have an approximately rectangular shape, the sections parallel to the plane of the structure being more spaced apart from one another in their respective planes.

As illustrated in FIG. 4D, the surface of membrane 11 (here corresponding to the active portion) is larger than in FIG. 4C. The capacitance is thus greater. The maximum stretched state corresponds to the maximum capacitance of the structure while the most compressed state corresponds to the minimum capacitance. The possible stretching Le–Lr, and thus the travel of limiters 21 and 22, is selected according to the possible stretching of membrane 11.

The limiting elements form mechanical springs outside of the plane of the deformable membrane. Using the third dimension enables, among others, to optimize the active surface of the membrane and thus the recovered power for a given surface bulk. Indeed, for a given surface area, the membrane remains approximately rectangular while known solutions exploit a trapezoidal deformation of the membrane, which is more bulky.

The membrane may be pre-stressed during the installation of the limiting elements, with a minimum stretching corresponding to the minimum length (contracted) of the limiting elements.

The greater the number of teeth or of meanders of limiting element, the greater the number of membrane connection points, and the more uniformly the deformation can be distributed in the active area, which keeps the membrane all the stronger. FIGS. 4A to 4D illustrate an embodiment in which the sections of the limiting elements are of constant length and only change shape. They are for example made of rigid thermoplastic and thermosetting-type polymer with a Young's modulus greater than that of the membrane and an elongation capacity smaller than that of the membrane. As a variation, the material forming the limiting elements is an elastomer, more resilient than the previously-mentioned materials and authorizing a deformation (elongation) of the meanders. This elongation capacity remains smaller than that of the membrane but favors the uniformity of the deformation undergone by the membrane. According to another variation, the horizontal sections are deformable lengthwise while the connections between the upper and lower sections are not deformed. These variations may of course be combined.

Figure 5:
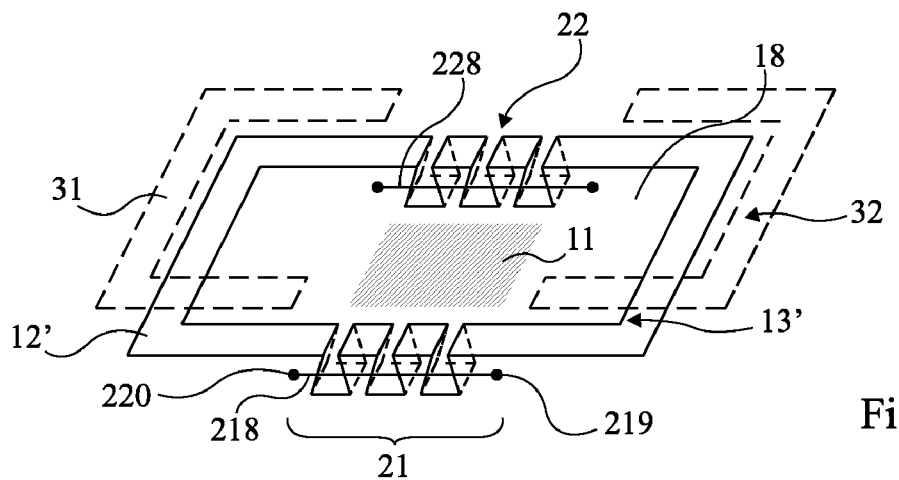
FIG. 5 is a perspective view of another embodiment of an electroactive polymer structure.

FIG. 5 is a simplified perspective view of another embodiment in which active membrane 11 of the structure does not cover the entire surface between supports. For example, the electrode surface area is smaller than the polymer film surface area. According to another example, the polymer-electrode sandwich is continued on either side in the deformation direction by an area 18 of a material that may be different. In this last case, the material is preferably non-deformable in the elongation direction to concentrate and increase the deformations in this area to optimize the efficiency. In the example of FIG. 5, inactive area 18 is made of the same material as membrane 11 around the active area and is punctually connected to the limiting elements. It can also be considered that the assembly of membrane 11 and of area 18 forms the electroactive membrane, only a central portion 11 of which is active.

FIG. 5 also illustrates a variation according to which the stretching of the meanders forming the limiting element is itself limited by a rod or a wire 218, respectively 228, crossing its meanders in a direction parallel to its main direction. In the example of FIG. 5, rod 228 limits the meanders elongation at its ends by two stops (for example, balls 219 and 220). The meanders can only stretch by the length of rod or wire 218 and 228. Stops may be provided between each meander to force the deformation distribution. A limiting element with open meanders, that is, without sections 223 to 225 (respectively 213 to 215), may also be envisaged, with rod 228 (respectively 218) ensuring the connection with the rest of the structure while limiting the stretching. Using a rod, a wire or another stop element to limit the meander elongation enables to overcome meander manufacturing tolerances, especially tolerances in the respective lengths of the different sections.

Further, support elements 12' and 13' have a shape adapted to the size of membrane 11. For example, each one is U-shaped, with its ends connected to the ends of the other element by a limiter. The supports and the limiters may also form a single part, provided for the limiting meanders to be located at the level of active portion 11.

FIG. 5 illustrates another variation according to which reinforcing elements 31 and 32 are added to the structure. In FIG. 5, elements 31 and 32 are used to grip electroactive membrane 11-18. They may also be used as a fixture for area 18 or to rigidify the structure to keep it planar.

However, the limiters are not necessarily located laterally with respect to the structure.

Figure 6:
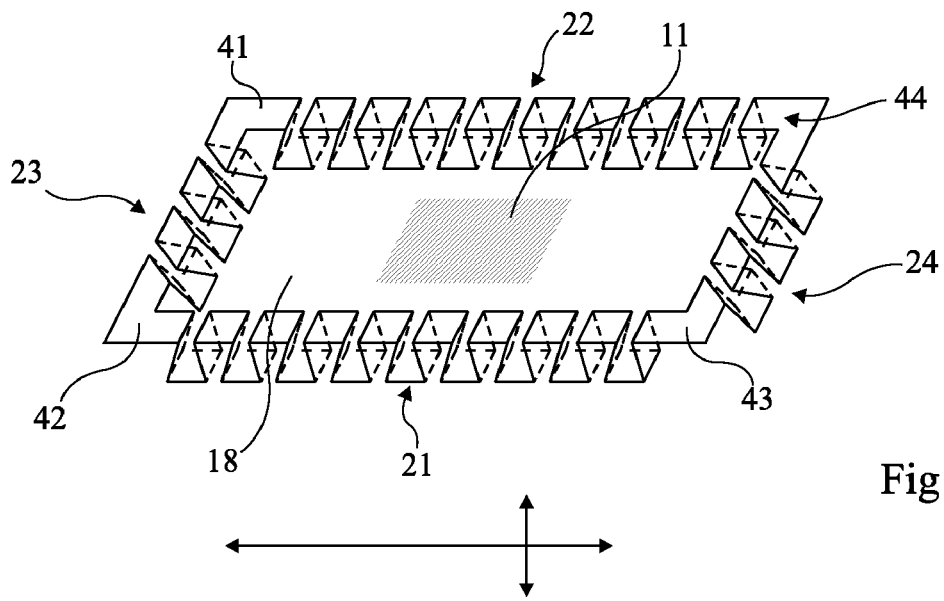
FIG. 6 is a perspective view of another embodiment of an electroactive polymer structure.

FIG. 6 shows another embodiment in which limiting elements 21 to 24 are provided in the four directions of membrane 11. Such an embodiment is more specifically intended for the case where the membrane is capable of being stretched/deformed in several directions. Corners 41, 42, 43, and 44 of the structure form the support elements which will be connected to the object initiating the deformations. Membrane 11 may take up the entire space between limiters or, as shown, be surrounded by a flexible inactive area 18. In this case, area 18 is deformable in all directions.

In FIGS. 3 to 6, the limiting elements have been shown as continuing the supports. In practice, they will often be made of a different material to give them the ability to deform. In particular, the limiting elements may also have a spring function. In certain cases, in particular if area 18 is pre-stressed, the limiter may be used as an anchor point for the polymer and guarantee the planar rectangular shape of the structure.

Figure 7:
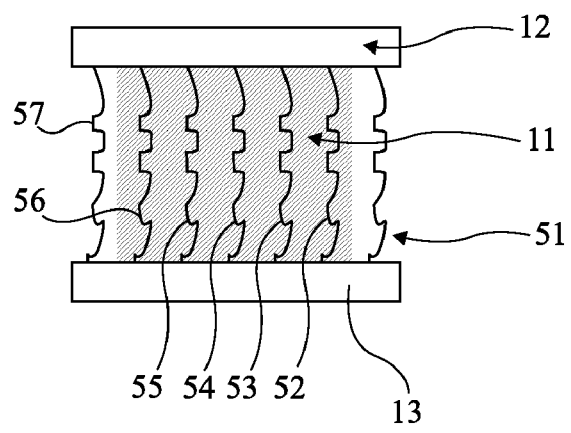
FIG. 7 is a top view of another embodiment of an electroactive polymer structure.

FIG. 7 illustrates an alternative embodiment in which several limiting elements 51 to 57, distributed perpendicularly to the deformation direction, connect the two supports of the active area. These limiting elements are for example yarns of a woven object which are provided with an initial length greater than the interval in the idle state between support elements 12 and 13. These yarns determine the maximum stretching of the active area and form, as in the previous embodiments, elements limiting the deformation outside of the active area plane. The support elements may be weft yarns of the fabric.

Of course, the different variations may be combined.

It should be noted that the implementation of the present invention requires no modification of the actual active structure.

Figure 8:
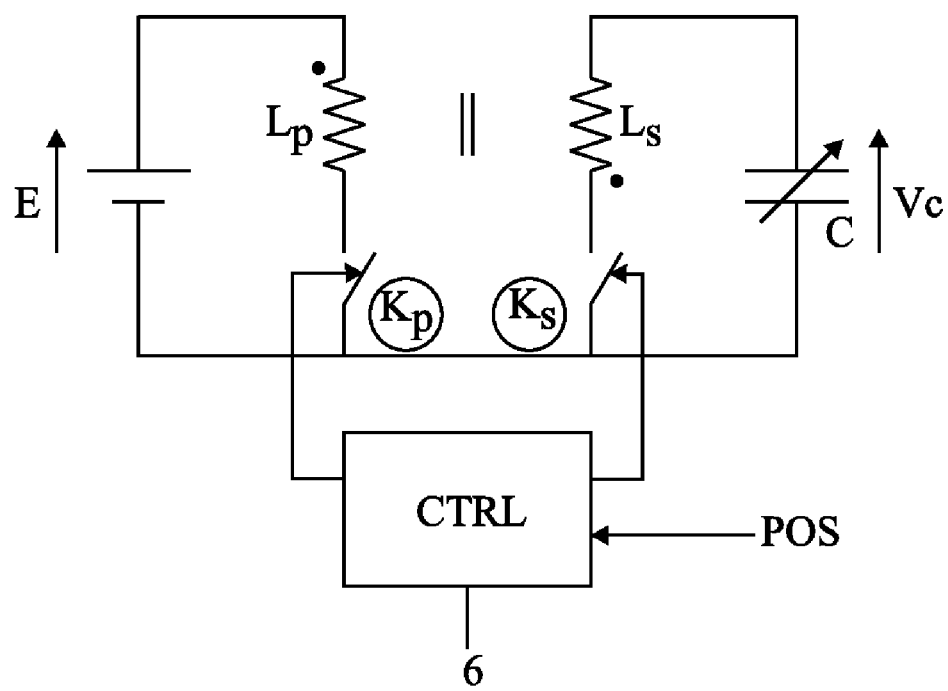
FIG. 8 is a simplified electric diagram of a circuit for controlling and synchronizing an electroactive polymer structure.

FIG. 8 is a simplified electric diagram of a power recovery system. This example is a D.C./D.C. converter of flyback type. Variable capacitance C formed by active membrane 11 is connected by a switch Ks to secondary winding Ls of a transformer. Primary winding Lp of the transformer is connected, by a switch Kp, across a voltage source E used as a storage source. The phase points of windings Lp and Ls are inverted. Switches Kp and Ks are controlled by a circuit 6 synchronizing their closing periods according to the position of the structure. This position is for example provided to circuit 6 in the form of a position signal POS with two states obtained by detection of the stretched/retracted position of the membrane. For example, the circuit capacitance values (minimum and maximum) are detected to deduce the stretched or compressed state of the active portion. To charge variable capacitance C, switch Kp is turned on (switch Ks off) until the magnetic circuit powered by voltage source E is fully charged. The turning off of switch Kp and the turning on of switch Ks enable to transfer the power of the magnetic circuit into variable capacitance C formed by the active area. The structure charges under its maximum capacitance. Both switches are then turned off to start the recovery phase. The structure (capacitance C) mechanically moves and its capacitance varies, for example, from a maximum value to a minimum value. To discharge the capacitance, switch Ks is closed long enough for the power to be transferred to the magnetic circuit. Finally, switch Ks is turned off and switch Kp is turned on to transfer this power to storage unit E. The synchronization of the power acquisition cycle must be performed on the mechanical motions of the structure, such a synchronization being current per se. According to the applications, the recovered power is stored in a battery or capacitor-type element or generated when the application requires it.

A same control and transfer circuit may manage several structures, for example, several stacked membranes 11 connected to a same support.

Other usual control and transfer circuits may be used, the present invention only affecting the structure connecting the transducer to its support.

The practical implementation of the present invention is within the abilities of those skilled in the art based on the functional indications given hereabove. In particular, the selection of the materials used to form the limiting elements depends on the application and especially on the object supporting the structure (fabric, self-contained object, etc.). Further, the selection of the shape of the limiting element between rectangular or rounded meanders depends on the application and on the available structures. Moreover, the selection of the fastening and connection means is within the abilities of those skilled in the art based on the application, for example, by using the same type of means as in support-membrane connections. Finally, although the present invention has been described in relation with several limiting elements between the two membrane supports, a single limiting element may be provided, which is then preferably centered between the two supports.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An electroactive polymer transducer comprising:
    an active membrane formed of an approximately rectangular electroactive polymer portion between two parallel electrodes, at least two points of said active membrane being connected to rigid supports maintaining said electroactive polymer in a plane and adapted to transmit a mechanical constraint according to a privileged deformation direction in said plane; and
    at least one limiting element connecting said supports and having a meandering shape, said limiting element limiting the deformation of the membrane according to the privileged deformation direction, and being connected to the membrane at several approximately distributed points.

2. The transducer of claim 1, wherein the electrodes sandwich the membrane.

3. The transducer of claim 1, wherein the electrodes are on a same side of the membrane.

4. The transducer of claim 1, wherein the limiting element undergoes deformations non coplanar to the deformations of the membrane.

5. The transducer of claim 1, wherein two supports are in the plane of the membrane and are approximately perpendicular to the limiting element.

6. The transducer of claim 1, wherein the membrane is surrounded by a non-active area.

7. The transducer of claim 6, wherein said area is not deformable in the deformation direction of the membrane.

8. The transducer of claim 1, comprising several parallel limiting elements.

9. The transducer of claim 8, wherein meanders are formed by the limiting elements in planes perpendicular to the plane of the membrane.

10. The transducer of claim 8, wherein the limiting elements and the supports are one and the same part forming a frame around the membrane.

11. The transducer of claim 1, wherein several membranes are superposed and share same supports and limiting elements.

12. The transducer of claim 1, wherein the elongation of the meandering shape is limited by stop elements.

13. A system for recovering power from a mechanical stretching, comprising at least one transducer of any one of the preceding claims and one electronic circuit for managing the charge and the discharge of the transducer.

14. An actuator system comprising an electronic circuit for generating an electric field and at least one transducer of claim 1.

15. The transducer of claim 1, wherein the limiting element presents an elongation capacity lower than that of the active membrane.

* * * * *